United States Patent
Lee et al.

(10) Patent No.: US 8,310,062 B2
(45) Date of Patent: Nov. 13, 2012

(54) STACKED SEMICONDUCTOR PACKAGE

(75) Inventors: Jun-Ho Lee, Gyeonggi-do (KR);
Hyung-Dong Lee, Gyeonggi-do (KR);
Hyun-Seok Kim, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 824 days.

(21) Appl. No.: 12/346,429

(22) Filed: Dec. 30, 2008

(65) Prior Publication Data

US 2010/0164076 A1     Jul. 1, 2010

(30) Foreign Application Priority Data

Dec. 26, 2008 (KR) .................. 10-2008-0134578

(51) Int. Cl.
*H01L 23/552* (2006.01)
*H01L 23/02* (2006.01)
(52) U.S. Cl. . 257/777; 257/659; 257/686; 257/E23.002; 257/E23.114; 361/816; 361/818
(58) Field of Classification Search .......... 257/659, 257/686, 777, E23.002, E23.114; 361/816, 361/818
See application file for complete search history.

(56) References Cited

U.S. PATENT DOCUMENTS

| | | | | |
|---|---|---|---|---|
| 7,768,135 | B1 * | 8/2010 | St. Amand et al. | 257/777 |
| 2004/0080045 | A1 * | 4/2004 | Kimura et al. | 257/736 |
| 2004/0195591 | A1 * | 10/2004 | Gehman et al. | 257/202 |
| 2005/0006745 | A1 * | 1/2005 | Nishimura | 257/686 |
| 2005/0194694 | A1 * | 9/2005 | Takahashi | 257/777 |
| 2006/0063312 | A1 * | 3/2006 | Kurita | 438/127 |
| 2007/0096335 | A1 * | 5/2007 | Kwon et al. | 257/777 |
| 2007/0152313 | A1 * | 7/2007 | Periaman et al. | 257/686 |
| 2008/0112150 | A1 | 5/2008 | Jones | |

FOREIGN PATENT DOCUMENTS

| | | |
|---|---|---|
| JP | 2008-311379 | 12/2008 |
| KR | 1020040025631 | 3/2004 |
| KR | 2006-0055564 | 5/2006 |
| KR | 100714917 | 4/2007 |
| KR | 100792145 | 12/2007 |

* cited by examiner

*Primary Examiner* — Peniel M Gumedzoe
(74) *Attorney, Agent, or Firm* — IP & T Group LLP

(57) ABSTRACT

A semiconductor package includes a wire board, a plurality of semiconductor chips configured to be stacked over the wire board and to be electrically coupled with the wire board, and at least one shielding unit configured to be formed between the plurality of semiconductor chips and to be maintained at a predetermined voltage.

16 Claims, 2 Drawing Sheets

STACKED SEMICONDUCTOR PACKAGE

CROSS-REFERENCE TO RELATED APPLICATION

The present invention claims priority of Korean patent application number 10-2008-0134578, filed on Dec. 26, 2008, which is incorporated by reference in its entirety.

BACKGROUND OF THE INVENTION

The present invention relates to a semiconductor package, and more particularly, to a stacked semiconductor package.

Recent research trend of an electronic industry is to develop a miniaturized semiconductor. A System On Chip (SOC) technique and a System In Package (SIP) technique are used for miniaturizing a semiconductor. Several separate semiconductor elements are integrated into one semiconductor chip employing the SOC technique. A plurality of semiconductor chips are combined into one semiconductor package using the SIP technique. In specific, in the SIP technique, the plurality of semiconductor chips are loaded vertically or horizontally on a substrate to be integrated into a semiconductor package. This SIP technique is similar to an existing Multi-Chip Module (MCM) technique. A difference is that the semiconductor chips are loaded horizontally in the MCM but the semiconductor chips are stacked vertically in SIP.

According to the SIP, the plurality of semiconductor chips are located up and down and opposite to each other at a close distance. This stacked structure enables an electromagnetic wave and a noise to have an influence on the semiconductor chips, or enables Electro Magnetic Interference (EMI), which causes malfunctions of an internal circuit in a semiconductor, to occur due to the electromagnetic wave induced from an external.

Particularly, when a semiconductor memory having a large switching noise and a Radio Frequency (RF) chip very sensitive to a noise are packaged together, performances of the RF chip may be seriously degraded due to the EMI.

SUMMARY OF THE INVENTION

Embodiments of the present invention are directed to provide a stacked semiconductor package capable of preventing malfunctions of the semiconductor chips caused by the EMI.

In accordance with an aspect of the present invention, there is provided a stacked semiconductor package including a wire board, a plurality of semiconductor chips configured to be stacked over the wire board and to be electrically connected with the wire board, and at least one shielding unit configured to be formed between the plurality of semiconductor chips and to be maintained at a predetermined voltage.

In accordance with another aspect of the present invention, there is provided a stacked semiconductor package including a wire board, a plurality of semiconductor chips configured to be stacked over the wire board and to be electrically connected with the wire board, a plurality of interposer chips configured to be located between the plurality of semiconductor chips, and a conductor configured to be formed on at least one of the plurality of interposer chips and to be maintained at a predetermined voltage.

According to the present invention, electro magnetic waves inducing the EMI between the semiconductor chips are shielded by having a conductor formed between the semiconductor chips stacked, and malfunctions of internal circuits in the semiconductor chips are prevented.

Additionally, in accordance with some embodiments of the present invention, the conductor is maintained at a predetermined voltage through a via-hole, and thus defects of a wire bonding may be avoided in an effective manner.

DESCRIPTION OF SPECIFIC EMBODIMENTS

Figure 1:
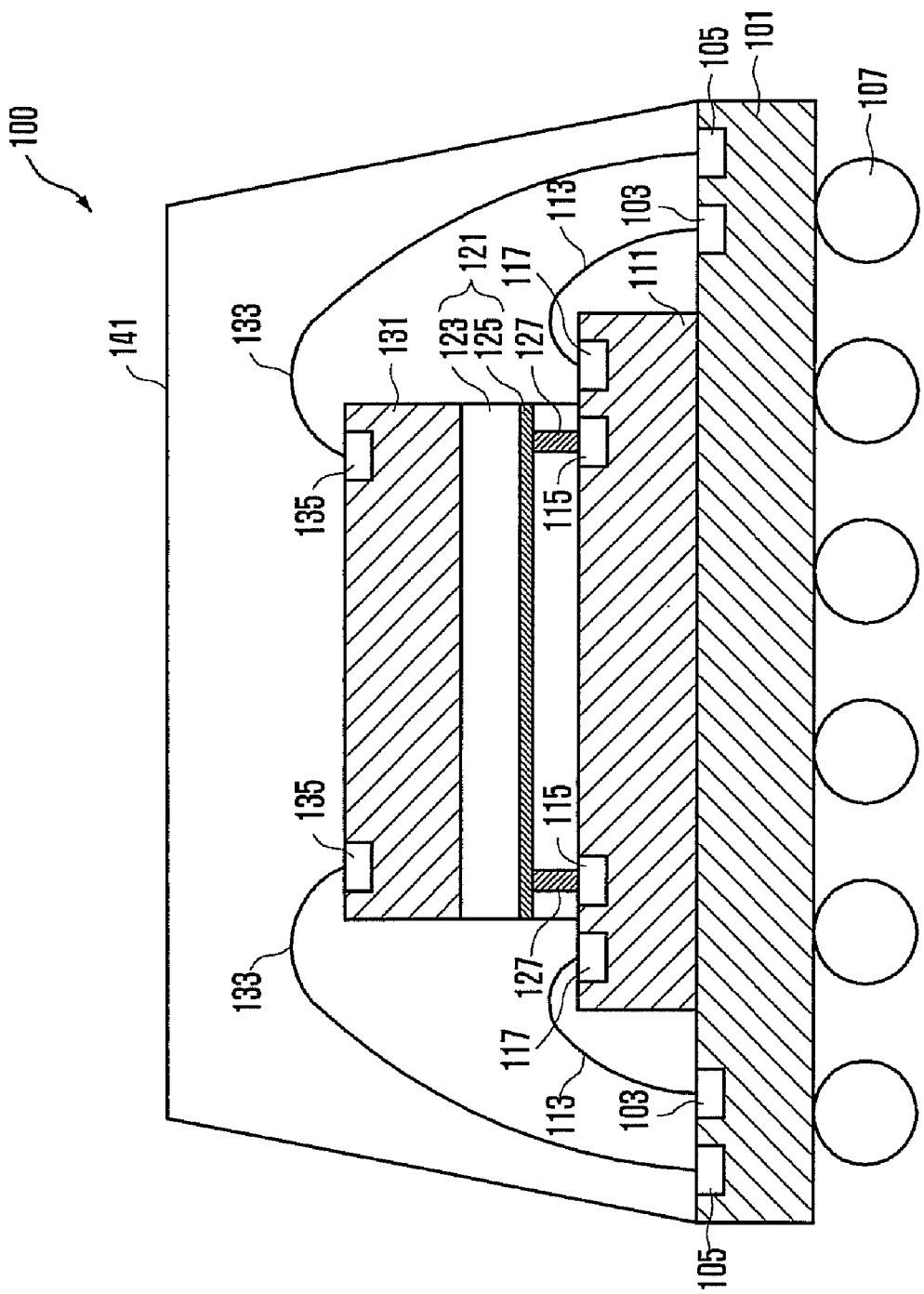
FIG. 1 is a cross-sectional view illustrating a stacked semiconductor package in accordance with an embodiment of the present invention.

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout.

FIG. 1 is a cross-sectional view illustrating a stacked semiconductor package in accordance with an embodiment of the present invention.

As shown, the stacked semiconductor package 100 in accordance with an embodiment of the present invention includes a wire board 101, a first semiconductor chip 111, a second semiconductor chip 131 and a shielding unit 121.

The wire board 101 is a multi-layer printed circuit board on which multi-layer metal lines are formed, and includes first and second pads 103 and 105 and solder balls 107. The first and second pads 103 and 105 are electrically connected with the first and second semiconductor chips 111 and 131. The solder balls 107 are electrically connected with external elements and each acts as an external connection terminal. The first and second pads 103 and 105 are electrically connected with the solder balls 107 through the metal wire on the wire board 101.

The first semiconductor chip 111 is stacked on the wire board 101. A first bonding wire 113 connects a third pad 117 of the first semiconductor chip 111 with the first pad 103, and thus the first semiconductor chip 111 is electrically connected with the wire board 101. The second semiconductor chip 131 is stacked on the shielding unit 121 stacked over the first semiconductor chip 111. A second bonding wire 133 connects a fourth pad 135 of the second semiconductor chip 131 with the second pad 105, and thus the second semiconductor chip 131 is electrically connected with the wire board 101. Wire bonding may be formed using a ball bonding, a wedge bonding, or a bump reverse bonding, etc.

Meanwhile, as shown in FIG. 1, the first to fourth pads 103, 105, 117 and 135 are used as a ground pad. Even though the first to fourth pads 103, 105, 117 and 135 are shown as a ground pad in FIG. 1, the wire board 101, the first semiconductor chip 111 and the second semiconductor chip 131 include a plurality of pads (not shown) used as a power pad and a signal pad, etc.

The shielding unit 121 is formed between the first and second semiconductor chips 111 and 131 and includes an interposer chip 123 and a conductor 125. The interposer chip 123 prevents a physical contact between the first and second semiconductor chips 111 and 131 and includes a bonding pad and a metal wire.

The conductor 125 is formed below the interposer chip 123 and a predetermined voltage is kept therein. That is, the conductor 125 keeps a ground voltage VSS by being connected electrically with the fifth pad 115 of the first semiconductor chip 111 through a via-hole 127 formed through the interposer chip 123. Therefore, the conductor 125 shields electro magnetic waves generated from the first and second semiconductor chips 111 and 131 or input from an external environment. Here, the conductor 125 is made of an excellent conductive material.

For example, even though the first semiconductor chip 111 generates a lot of electro magnetic waves, the electro magnetic waves are shielded by the conductor 125, and thus the malfunctions of the second semiconductor chip 131 sensitive to the electro magnetic waves are decreased. As a result, in the stacked semiconductor package in accordance with an embodiment of the present invention, the electro magnetic interference (EMI) caused by the electro magnetic waves generated from the first and second semiconductor chips 111 and 131 or input from an external environment is decreased in the first and second semiconductor chips 111 and 131. Additionally, the conductor 125 may be electrically connected with a power pad (not shown) of the first semiconductor chip 111 through the via-hole 127.

Meanwhile, the conductor 125 is formed below the interposer chip 123 as a predetermined pattern. It is preferred that the conductor 125 is formed as a mesh pattern based on process reliability pursuant to a process rule and a weight of the conductor 125.

The via-hole 127 connects electrically the conductor 125 with the fifth pad 115 of the first semiconductor chip 111 and is formed through the interposer chip 123. Here, the internal of the via-hole 127 is filled with a conductive material. An excellent conductive metal is used as the conductive material to improve a ground. Additionally, defects of the boding wire such as disconnection and short states, etc., which are caused by a resin flow during the forming of an encapsulating material 141 of resin material, are prevented by using the via-hole 27 instead of a wire bonding to connect electrically the conductor 125 with the fifth pad 115 of the first semiconductor chip 111.

As aforementioned, the encapsulating material 141 protects the first and second semiconductor chips 111 and 131 from a mechanical or electrical impact.

Meanwhile, a printed circuit board is illustrated as the wire board shown in FIG. 1, but a tape wire board and a silicon board, etc. may be used as the wire board 101.

Figure 2:
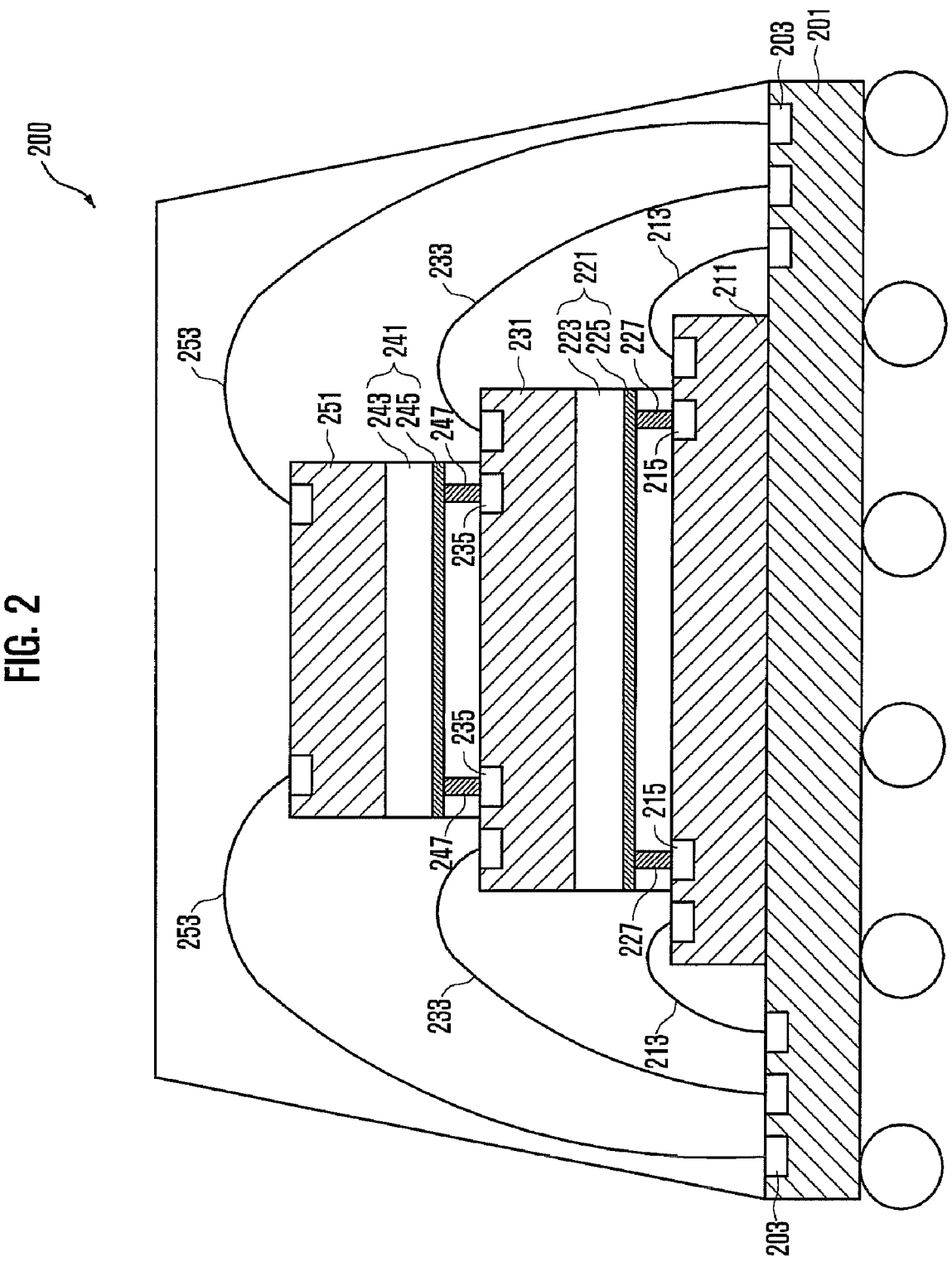
FIG. 2 is a cross-sectional view illustrating a stacked semiconductor package in accordance with another embodiment of the present invention.

FIG. 2 is a cross-sectional view of a stacked semiconductor package in accordance with another embodiment of the present invention.

As shown, more than two of semiconductor chips may be stacked and three exemplary semiconductor chips 211, 231 and 251 stacked are illustrated in case that pads of the wire board 201 and the first, second and third semiconductor chips 211, 231 and 251 are ground pads.

As shown in FIG. 2, the stacked semiconductor package 200 in accordance with another embodiment of the present invention includes the wire board 201, the first to third semiconductor chips 211, 231 and 251 and shielding units 221 and 241.

The first to third semiconductor chips 211, 231 and 251 are stacked sequentially over the wire board 201, and first to third bonding wires 213, 233 and 253 connect electrically the first to third semiconductor chips 211, 231 and 251 with the wire board 201, respectively. The wire board 201 includes a first pad 203 which is electrically coupled with the third semiconductor chip 251.

The shielding units 221 and 241 are located between the first and second semiconductor chips 211 and 231 and between the second and third semiconductor chips 231 and 251, respectively. The shielding units 221 and 241 include first and second interposer chips 223 and 243 and first and second conductive bodies 225 and 245, respectively. A first via-hole 227 connects electrically the first conductor 225 with the second pad 215 of the first semiconductor chip 211, and a second via-hole 247 connects electrically the second conductor 245 with the third pad 235 of the second semiconductor chip 231.

Here, the shielding units 221 and 241 may include or not include the conductive bodies depending on an extent that a noise or electro magnetic wave has an influence on a semiconductor chip, and a via-hole is determined by whether a conductor is included or not.

While the present invention has been described with respect to the specific embodiments, it will be apparent to those skilled in the art that various changes and modifications may be made without departing from the spirit and scope of the invention as defined in the following claims.

What is claimed is:

1. A stacked semiconductor package, comprising:
a wire board;
a first semiconductor chip stacked over the wire board and electrically coupled with the wire board;
a shielding unit formed over the first semiconductor chip for blocking electromagnetic waves from the first semiconductor chip, wherein the shielding unit includes a conductor, a constant fixed voltage is applied to the conductor, and the conductor is directly and electrically coupled with a ground pad of the first semiconductor chip through a via-hole formed through the shielding unit; and
a second semiconductor chip stacked over the shielding unit and electrically coupled with the wire board.

2. The stacked semiconductor package of claim 1, wherein the shielding unit includes an interposer chip configured to electrically couple the first and second semiconductor chips with the wire board and further includes the conductor formed inside the interposer chip.

3. The stacked semiconductor package of claim 1, wherein the constant fixed voltage is a ground voltage.

4. The stacked semiconductor package of claim 2, wherein the conductor is electrically coupled with the ground pad of the first semiconductor chip through the via-hole formed through the interposer chip.

5. The stacked semiconductor package of claim 4, wherein the ground pad of the first semiconductor chip is electrically coupled with a ground pad on the wire board.

6. The stacked semiconductor package of claim 5, wherein the second semiconductor chip has an internal circuit sensitive to electromagnetic waves.

7. The stacked semiconductor package of claim 6, wherein the first semiconductor chip has an internal circuit which radiates electromagnetic waves.

8. The stacked semiconductor package of claim 7, further including a plurality of bonding wires configured to electrically couple the wire board with the first and second semiconductor chips.

9. The stacked semiconductor package of claim 8, further including an encapsulating material configured to mechanically or electrically protect the first and second semiconductor chips.

10. A stacked semiconductor package, comprising:
a wire board;
a first semiconductor chip stacked over the wire board and electrically coupled with the wire board;

a conductor formed over the first semiconductor chip, wherein a constant fixed voltage is applied to the conductor, an interposer chip formed over the first semiconductor chip, wherein the conductor is electrically coupled with a ground pad of the first semiconductor chip through a via-hole formed through the interposer chip; and a second semiconductor chip stacked over the interposer chip and electrically coupled with the wire board.

11. The stacked semiconductor package of claim 10, wherein the constant fixed voltage is a ground voltage.

12. The stacked semiconductor package of claim 10, wherein the ground pad of the first semiconductor chip is electrically coupled with a ground pad on the wire board.

13. The stacked semiconductor package of claim 12, wherein the second semiconductor chip has a circuit sensitive to electromagnetic waves.

14. The stacked semiconductor package of claim 13, wherein the first semiconductor chip has a circuit radiating electromagnetic waves.

15. The stacked semiconductor package of claim 14, further including a plurality of bonding wires configured to electrically connect the wire board with the first and second semiconductor chips.

16. The stacked semiconductor package of claim 15, further including an encapsulating material configured to mechanically or electrically protect the first and second semiconductor chips.

* * * * *